US012652760B2

(12) United States Patent
Tsai et al.

(10) Patent No.: US 12,652,760 B2
(45) Date of Patent: Jun. 9, 2026

(54) ELECTRONIC PACKAGE MODULE AND METHOD FOR FABRICATION OF THE SAME

(71) Applicant: USI Science and Technology (Shenzhen) Co., Ltd., Guangdong Province (CN)

(72) Inventors: Ming Chang Tsai, Guangdong Province (CN); Ta-Te Hsieh, Guangdong Province (CN)

(73) Assignee: USI Science and Technology (Shenzhen) Co., Ltd., Guangdong Province (CN)

( * ) Notice: Subject to any disclaimer, the term of this patent is extended or adjusted under 35 U.S.C. 154(b) by 301 days.

(21) Appl. No.: 18/481,256

(22) Filed: Oct. 5, 2023

(65) Prior Publication Data

US 2025/0056730 A1     Feb. 13, 2025

(30) Foreign Application Priority Data

Aug. 10, 2023     (CN) ......................... 202311009946.X

(51) Int. Cl.
*H05K 1/185* (2026.01)
*H10W 90/00* (2026.01)
(52) U.S. Cl.
CPC ............. *H05K 1/186* (2013.01); *H05K 1/185* (2013.01); *H05K 1/188* (2013.01); *H10W 90/00* (2026.01); *H05K 2201/0715* (2013.01); *H05K 2201/10015* (2013.01); *H05K 2201/1003* (2013.01); *H05K 2201/10454* (2013.01)

(58) Field of Classification Search
CPC ........ H05K 1/185; H05K 1/186; H05K 1/188; H05K 2201/10015; H05K 2201/1003; H01L 25/16
See application file for complete search history.

(56) References Cited

U.S. PATENT DOCUMENTS

| | | | |
|---|---|---|---|
| 8,593,825 B2 | 11/2013 | Chen | |
| 2004/0108587 A1* | 6/2004 | Chudzik | H01L 23/49827 257/E23.079 |

(Continued)

FOREIGN PATENT DOCUMENTS

| | | |
|---|---|---|
| CN | 108292641 A | 7/2018 |
| CN | 110416192 A | 11/2019 |

(Continued)

*Primary Examiner* — Nathan Milakovich
(74) *Attorney, Agent, or Firm* — CKC & Partners Co., LLC

(57) ABSTRACT

An electronic package module and a method for fabrication of the same are provided. The electronic package module has the circuit substrate with the flat surface and the electronic component located on the circuit substrate. The electronic component includes the input end located on the flat surface of the circuit substrate and electrically connected to the circuit substrate. The electronic component includes the main part located on the input end and the ground end located on the main part. The input end and the ground end are located on two opposite sides of the main part separately and are located between the ground end and the circuit substrate. The input end, the main part and the ground end are arranged along the normal direction of the flat surface.

6 Claims, 7 Drawing Sheets

(56)                    References Cited

U.S. PATENT DOCUMENTS

2006/0118931 A1*  6/2006  Ho .................... H01L 23/49827
                                                    257/E23.062
2018/0092210 A1*  3/2018  Wang ................... H05K 3/0047
2020/0343049 A1*  10/2020  Paital ....................... H01G 4/38

FOREIGN PATENT DOCUMENTS

TW          I301739  B    10/2008
TW        202137450  A    10/2021
TW        202207356  A     2/2022
TW        202213698  A     4/2022

* cited by examiner

ELECTRONIC PACKAGE MODULE AND METHOD FOR FABRICATION OF THE SAME

RELATED APPLICATIONS

This application claims priority to China Application Serial Number 202311009946.X, filed Aug. 10, 2023, which is herein incorporated by reference in its entirety.

BACKGROUND

Technical Field

The present disclosure relates to an electronic package module. More particular, the present disclosure relates to the electronic package module with passive components and the method for fabrication of the same.

Description of Related Art

Electronic package modules contain various types of passive elements, such as capacitors. The passive components are mounted by surface mount technology (SMT), which is to connect the input ends and the ground ends of those passive components with the circuit substrates through the soldering materials on their surfaces. Since the sizes of some passive components, such as capacitors and inductors are large, the sizes of electronic package modules are limited by those passive components. Thus the sizes of electronic package modules are difficult to reduce. On the other hand, the quantity of the passive components which can be disposed in one electronic package module is limited when the size of electronic package modules cannot be increased.

SUMMARY

Accordingly, the disclosure is to provide an electronic package module and the method for fabrication of the same, thereby increasing the quantity of the electronic components (e.g. passive components) disposed in the electronic package module.

At least one embodiment of the disclosure provides an electronic package module. The electronic package module includes a circuit substrate including a flat surface, an electronic component disposed on the circuit substrate. The electronic component including an input end located on the flat surface of the circuit substrate and electrically connected to the circuit substrate. The electronic component includes a main part located on the input end and a ground end located on the main part. The input end and the ground end are separately located on two opposite sides of the main part, and the input end and the main part are located between the ground end and the circuit substrate. The input end, the main part and the ground end are arranged along a normal direction of the flat surface.

At least one embodiment of the disclosure provides a method for fabricating an electronic package module including providing a circuit substrate having a flat surface. The method includes providing an electronic component including a main part, an input end and a ground end separately located on two sides of the main part; and perpendicularly disposing the electronic component on the flat surface of the circuit substrate. The input end is connected to the circuit substrate. The ground end is disposed away from the circuit substrate along with a normal direction of the flat surface, while the ground end overlaps the input end in the normal direction.

According to the aforementioned embodiments, the passive electronic component is perpendicularly disposed on the circuit substrate, while the input end and the ground end of the electronic component are electrically connected to the circuit substrate and the metal layer. Therefore, the area where the electronic component occupying is reduced, so that the density of the electronic component can be increased. Thereby, the goal of reducing the size of the electronic package module can be achieved.

BRIEF DESCRIPTION OF THE DRAWINGS

To illustrate more clearly the aforementioned and the other features, merits, and embodiments of the present disclosure, the description of the accompanying figures are as follows.

DETAILED DESCRIPTION

Figure 1A:
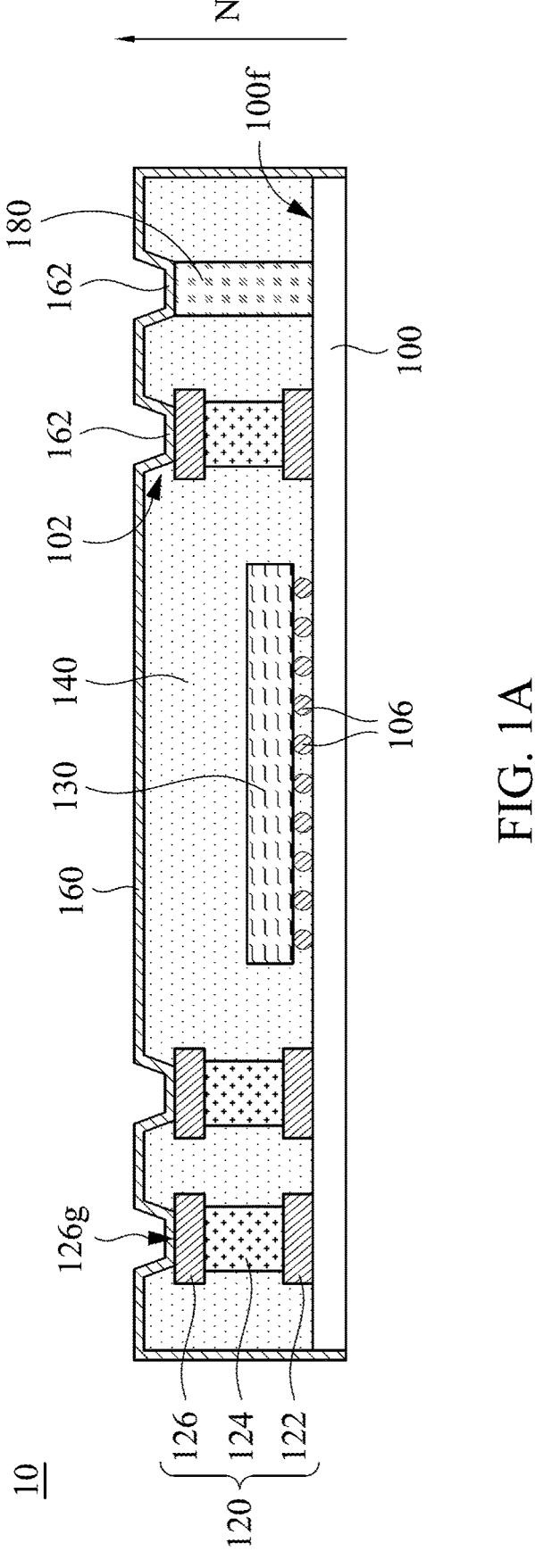
FIG. 1A illustrates a cross-sectional view of an electronic package in accordance with one embodiment of the present disclosure.

Referring to FIG. 1A, the electronic package module 10 of at least one embodiment is disclosed. The electronic package module 10 includes the circuit substrate 100 and the electronic component 120. The electronic component 120 is disposed on the circuit substrate 100 and includes the input end 122, the main part 124 and the ground end 126. As shown in FIG. 1A, the circuit substrate 100 has the flat surface 100f, and the input end 122 is located on the flat surface 100f of the circuit substrate 100 and is electrically connected to the circuit substrate 100.

The main part 124 is located on the input end 122, while the ground end 126 is located on the main part 124. Specifically, the input end 122 and the ground end 126 are separately located on two opposite sides of the main part 124, but only the input end 122 is connected to the circuit substrate 100. In other words, the input end 122 and the main part 124 are located between the ground end 126 and the circuit substrate 100, and the input end 122, the main part 124 and the ground end 126 are arranged along the normal direction N1 of the flat surface 100f.

Figure 2:
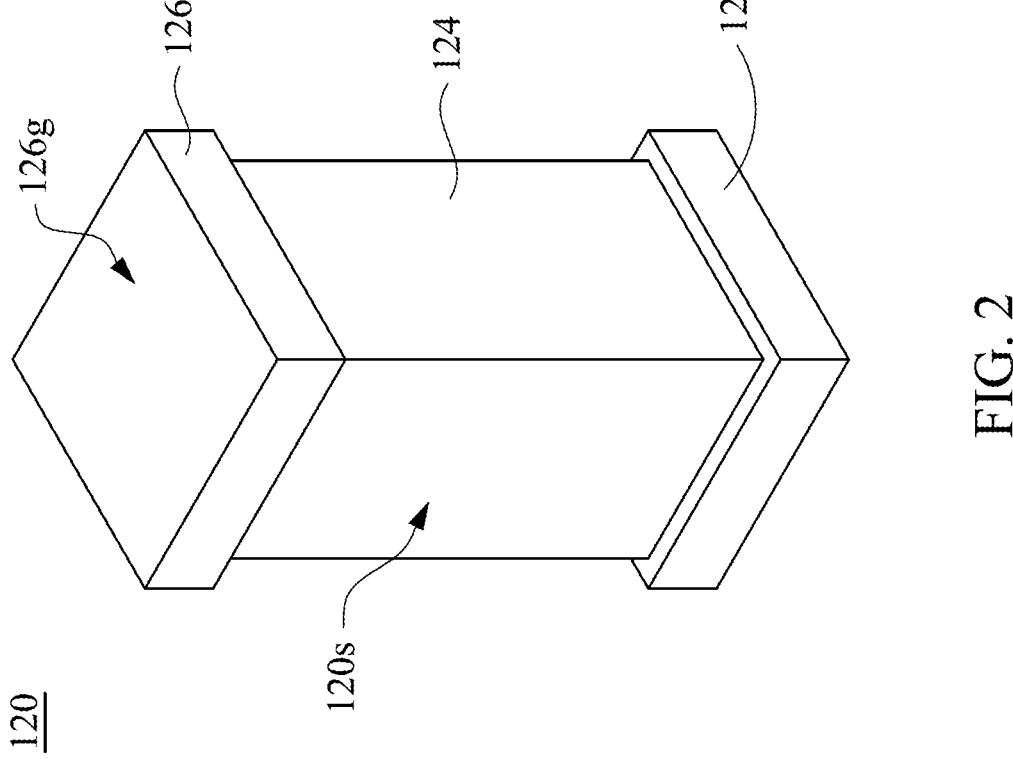
FIG. 2 illustrates a stereographic view of an electronic package in accordance with one embodiment of the present disclosure.

In the embodiment, the electronic component 120 may be a passive component, such as a capacitor or an inductor. For instance, the electronic component 120 may be a multi-layer ceramic capacitor (MLCC) in the 01005 inch size. Referring to FIG. 2, the electronic component 120 has the side surface 120s which includes one side surface (not denoted) of the input end 122, one side surface (not denoted) of the main part 124 and one side surface (not denoted) of the ground end 126. Furthermore, the ground end 126 located on one end of the electronic component 120 includes the ground surface 126g. In various embodiments of this disclosure, the area of the ground surface 126g is smaller than the area of the side surface 120s.

It is worth mentioning, the quantity of the electronic component 120 of the disclosure is not limited to this embodiment. That is, the quantity of the electronic component 120 may be more than one, e.g. three electronic components 120. Referring to FIG. 1A, the electronic package module 10 may further include the electronic component 130. The electronic component 130 is electrically connected to the circuit substrate 100 through the plurality of soldering materials 106. In the embodiment, the electronic component 130 may be an active component, such as a transistor. However, in other embodiments of the disclosure, the categories of the electronic component 120 and the electronic component 130 are not limited to this embodiment.

The electronic package module 10 further includes the encapsulation layer 140 which partially covers the electronic component 120. Specifically, the encapsulation layer 140 encapsulates the electronic component 120 and the electronic component 130 and exposes a part of the ground end 126 of the electronic component 120, i.e., exposes a part of the ground surface 126g. The material of the encapsulation layer 140 may include organic resin (such as epoxy resin), other insulation material or similarity thereof.

In addition, the electronic package module 10 further includes the metal layer 160. The metal layer 160 is located on the encapsulation layer 140 and is electrically connected to the ground end 126 of the electronic component 120. The metal layer 160 completely covers the surface of the encapsulation layer 140 (including the top surface and the side surface), and the metal layer 160 further covers the electronic component 120. The material of the metal layer 160 may include metal materials, such as copper, silver, aluminum or similarity thereof.

On the other hand, the electronic package module 10 further includes the conductive pillar 180. The conductive pillar 180 is located between the metal layer 160 and the circuit substrate 100 and is electrically connected to the metal layer 160 and the circuit substrate 100. The conductive pillar 180 may include metal materials, such as copper, nickel or other similar alloys. In other embodiments, the electronic package module 10 may include none of the conductive pillar 180.

Figure 3:
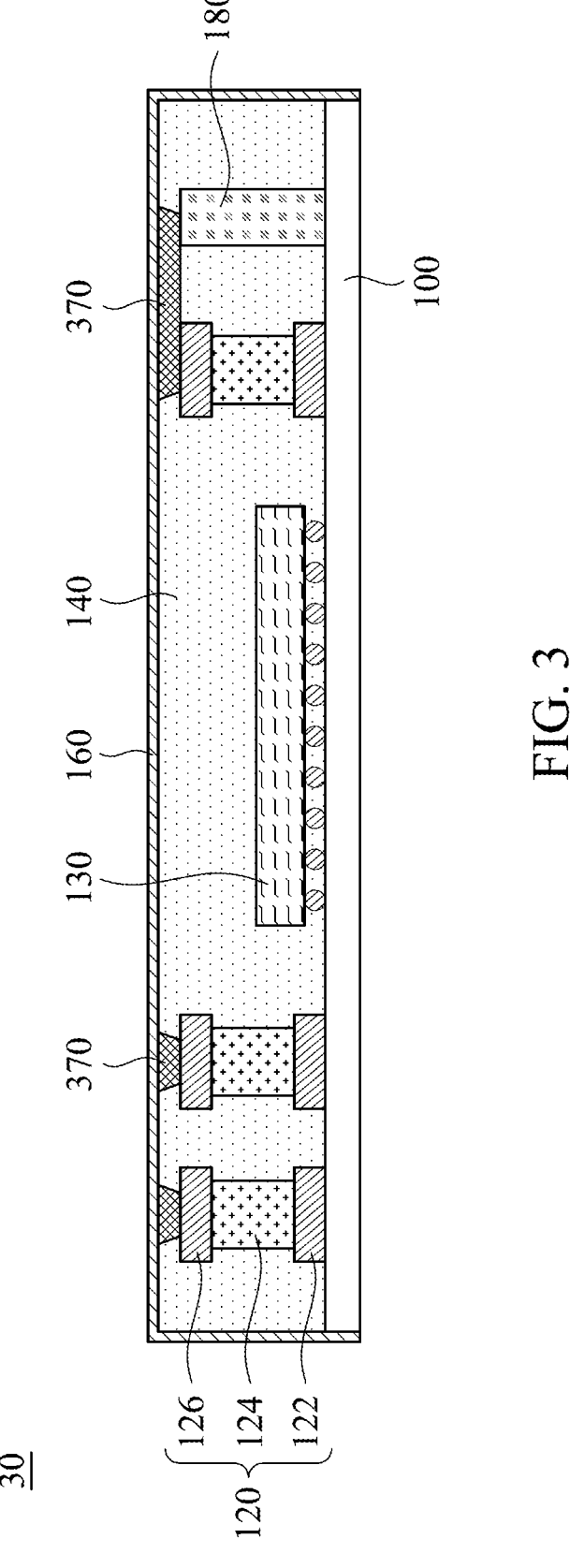
FIG. 3 illustrates a cross-sectional view of an electronic package in accordance with another embodiment of the present disclosure.

Specifically, the metal layer 160 covers the electronic component 120 and further directly touches the partial of the ground end 126 where the encapsulation layer 140 exposes. In other words, the metal layer 160 directly touches a part of the ground surface 126g and is electrically connected to the ground end 126. However, the disclosure is not limited to this embodiment. For example, in the embodiment of FIG. 3, the electronic package module 30 may further include the conductive material 370 which is disposed on the ground end 126. Two ends of the conductive material 370 are separately connected to the metal layer 160 and the ground end 126. Thus, the ground end 126 is electrically connected to the metal layer 160 through the conductive material 370.

Furthermore, the conductive pillar 180 is also electrically connected to the metal layer 160 through the conductive material 370. The conductive material 370 may include metals (e.g. copper or silver), conductive adhesives or similarities thereof.

Referring to the electronic package module 10 shown in FIG. 1A, the encapsulation layer 140 includes at least two openings 102, and theses openings 102 are separately located on the ground end 126 and the conductive pillar 180. On the other hand, the metal layer 160 extends into the openings 102 and is connected to the ground end 126 and the conductive pillar 180 separately through the openings 102. Specifically, at least two trench regions 162 are formed on the parts of the metal layer 160 where the openings 102 overlap. One of the trench regions 162 is connected to the ground end 126 of the electronic component 120, while the other one of the trench regions 162 is connected to the conductive pillar 180. In other words, one trench region 162 is connected to one electronic component 120 or one conductive pillar 180. As a result, at least two trench regions 162 are included in the embodiment which has one electronic component 120 and one conductive pillar 180. It is worth mentioning, the trench regions 162 of the metal layer 160 are electrically connected to the ground end 126 through direct touches.

Figure 1B:
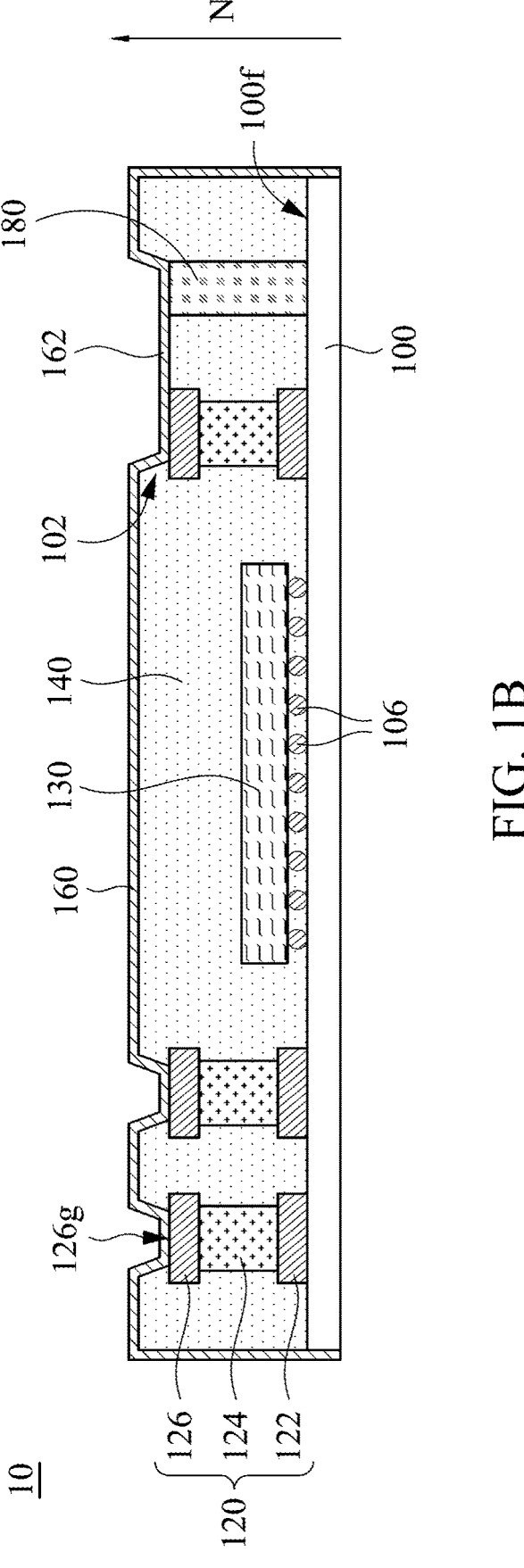
FIG. 1B illustrates a cross-sectional view of an electronic package in accordance with another embodiment of the present disclosure.

However, the disclosure is not limited to the embodiment. Referring to FIG. 1B, the encapsulation layer 140 includes the opening 102 which is located on the ground end 126 and the conductive pillar 180 in this embodiment. The metal layer 160 extends into this opening 102 and is connected to the ground end 126 and the conductive pillar 180 through the opening 102. Specifically, the trench region 162 is formed on the part of the metal layer 160 where the opening 102 overlaps, and this trench region 162 is connected to the ground end 126 and the conductive pillar 180. One trench region 162 may cover the ground end 126 of the electronic component 120 and also cover one end of the conductive pillar 180. In addition, one trench region 162 may cover (and is connected to) more than two electronic components 120. It is worth mentioning, the trench region 162 of the metal layer 160 in this embodiment is electrically connected to the ground end 126 and the conductive pillar 180 through direct touches.

Figure 4:
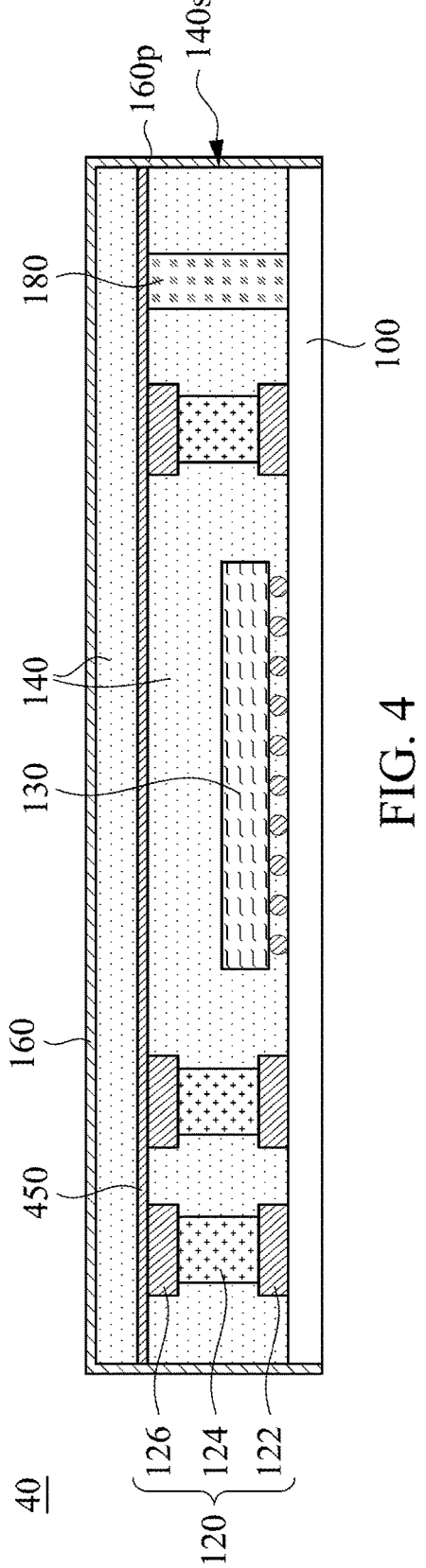
FIG. 4 illustrates a cross-sectional view of an electronic package in accordance with another embodiment of the present disclosure.

Referring to FIG. 4, the electronic package module 40 of another embodiment is disclosed. The electronic package module 40 is similar to the electronic package module 10, and the difference between these two embodiments is that the electronic package module 40 further includes the conductive layer 450. As shown in FIG. 4, the conductive layer 450 is located in the encapsulation layer 140 and covers the electronic component 120 and the conductive pillar 180. In the embodiment, a part of the encapsulation layer 140 is located between the metal layer 160 and the conductive layer 450. As a result, although the conductive pillar 180 is located between the metal layer 160 and the circuit substrate 100, the conductive pillar 180 does not directly touch the metal layer 160 in this embodiment.

In the embodiment, the conductive layer 450 directly touches the ground end 126 of the electronic component 120 and directly touches one end of the conductive pillar 180. Thus, the conductive layer 450 is electrically connected to the ground end 126 and the conductive pillar 180. It is worth mentioning, the part 160p of the metal layer 160 covers the side surface 140s of the encapsulation layer 140, while the conductive layer 450 directly touches the part 160p of the metal layer 160. However, the disclosure is not limited to this embodiment. In other embodiments, the conductive layer 450 may be completely isolated from the part 160*p* of the metal layer 160.

Figure 5:
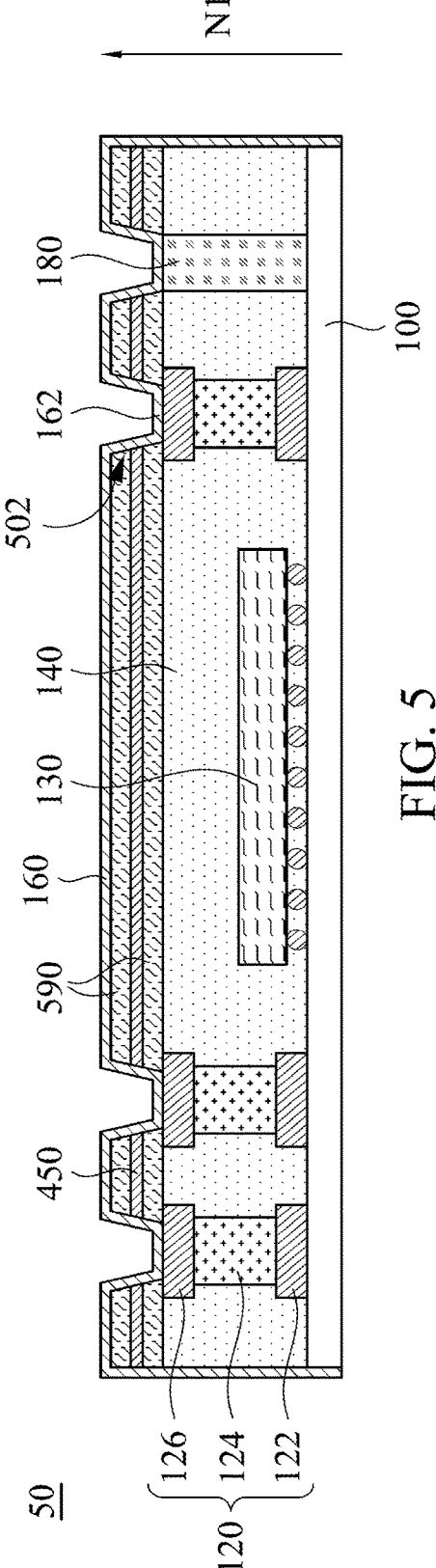
FIG. 5 illustrates a cross-sectional view of an electronic package in accordance with another embodiment of the present disclosure.

Referring to FIG. 5, the electronic package module 50 of another embodiment is disclosed. The electronic package module 50 is similar to the electronic package module 10, and the difference between these two embodiments is that the electronic package module 50 further includes the insulation film 590. The insulation film 590 is disposed between the encapsulation layer 140 and the metal layer 160 and partially covers the electronic component 120. Specifically, the insulation film 590 is located on the top surface (not denoted) of the encapsulation layer 140 and covers a part of the ground end 126 of each electronic component 120, while the other parts of the ground end 126 which are not covered by the insulation film 590 directly touch the metal layer 160. However, in other embodiments, the insulation film 590 may not cover the electronic component 120.

It is worth mentioning, the conductive layer 450 of the electronic package module 50 is located in the insulation film 590 and partially covers the electronic component 120. In the embodiment, the conductive layer 450 covers a part of the ground end 126 of the electronic component 120 without directly touching on the ground end 126 of the electronic component 120. In addition, the region of the ground end 126 which is not covered by the insulation film 590 may completely overlap the region of the ground end 126 which is not covered by the conductive layer 450. The conductive layer 450 may include metals (e.g. copper, nickel or other alloys), conductive adhesives or similarity thereof, while the insulation film 590 may include adhesive films, such as backside coating tapes.

In the embodiment, the insulation film 590 includes the openings 502 which are located on the ground ends 126. The metal layer 160 extends into the openings 502 and is connected to the conductive layer 450 and the ground end 126 through the openings 502. Specifically, the trench regions 162 are formed on the parts of the metal layer 160 where the openings 502 overlap, and each trench region 162 is connected to the conductive layer 450 and one ground end 126 of the electronic component 120. Since the trench regions 162 of the metal layer 160 are also connected to the conductive layer 450, each trench region 162 is electrically connected to the conductive layer 450 and the ground end 126. In other words, the trench regions 162 extend from the ground ends 126 to the conductive layer 450 along with the normal direction N1 and is electrically connected to the conductive layer 450 and the ground ends 126. As shown in FIG. 5, the trench regions 162 of the metal layer 160 are electrically connected to the conductive layer 450 and the ground ends 126 through direct touches.

It is worth mentioning, the quantities of the electronic component 130, the trench region 162, the conductive pillar 180 and the conductive material 370 are not limited to aforementioned embodiments. In other embodiments, the quantities of the electronic component 130, the trench region 162, the conductive pillar 180 and the conductive material 370 may be more than one. In addition, the quantity of the conductive layer 450 may be more than one, such as two.

Figure 6A:
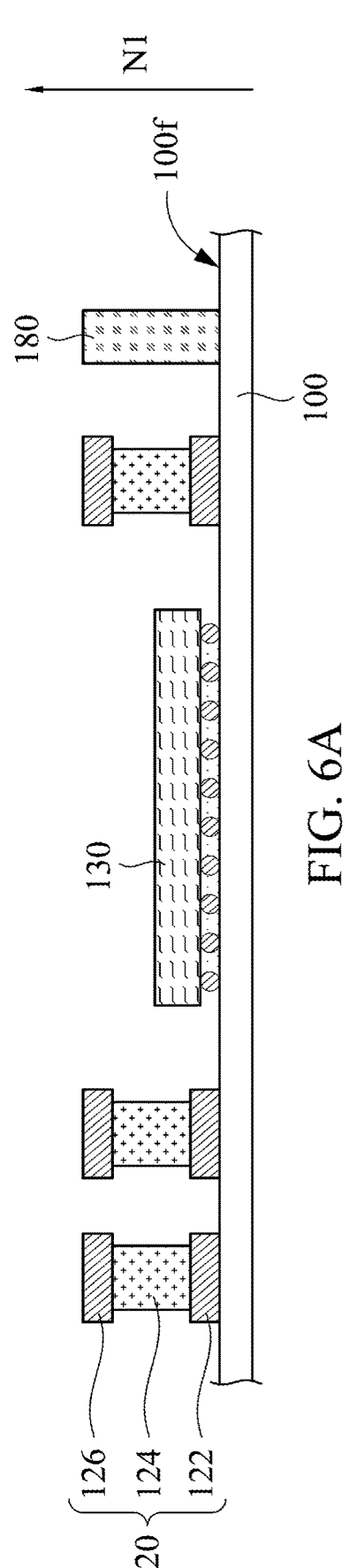
FIG. 6A to FIG. 6B illustrate cross-sectional views of a method for fabricating an electronic package module in accordance with one embodiment of the present disclosure.
Figure 6B:
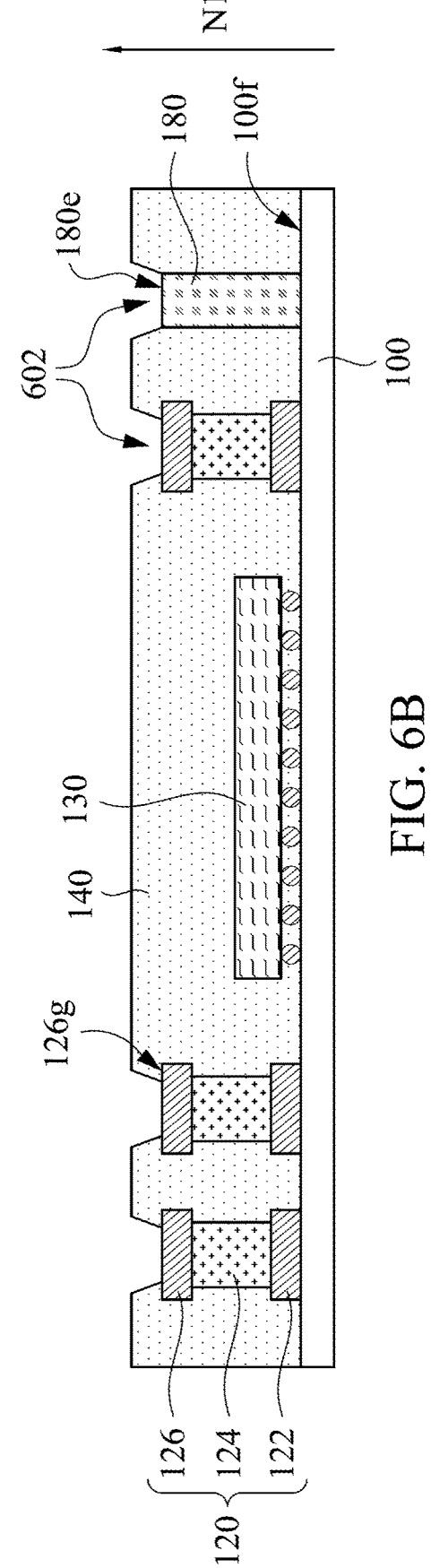

A method for fabrication of the electronic package module is disclosed while FIG. 6A to FIG. 6B illustrate sequent steps of this method in accordance with at least one embodiment of present disclosure. Referring to FIG. 6A, firstly, the circuit substrate 100 which has the flat surface 100*f* is provided. On the other hand, the electronic component 120 which has the main part 124 and the input end 122 and the ground end 126 located on two sides of the main part 124 is provided.

Afterwards, the electronic component 120 is perpendicularly disposed on the flat surface 100*f* of the circuit substrate 100, so that the input end 122 is connected to the circuit substrate 100. As shown in FIG. 6A, the ground end 126 is disposed along with the normal direction N1 of the flat surface 100*f* and is away from the circuit substrate 100. Furthermore, despite not depicted in figures, the electronic component 120 is soldered on the circuit substrate 100 through a plurality of soldering pads (not shown) on the flat surface 100*f*, so that the electronic component 120 is electrically connected to the circuit substrate 100. Theses soldering pads may include soldering materials, such as copper paste, silver paste or similarity thereof. Moreover, the circuit substrate 100 may further include at least one solder mask (not shown), and this solder mask may cover the flat surface 100*f* of the circuit substrate 100 and expose the soldering pads.

The aforementioned perpendicularly disposing indicates that the ground end 126 of the electronic component 120 overlaps the input end 122 in direction of the normal direction N1 of the flat surface 100*f*. As a result, the input end 122 directly touches the circuit substrate 100, while the main part 124 and the ground end 126 do not directly touch the circuit substrate 100.

Referring to FIG. 6B, the encapsulation layer 140 is formed on the circuit substrate 100 after the electronic component 120 is disposed. During this step, the top surface (not denoted) of the encapsulation layer 140 protrudes from the ground surface 126*g* of the electronic component 120 and covers the whole ground surface 126*g* of the electronic component 120.

Afterwards, the plurality of openings 602 may be formed on the encapsulation layer 140 by laser cutting or laser ablation, and the openings 602 expose the ground surface 126*g* of the ground end 126. Specifically, each of the openings 602 exposes one ground surface 126*g* of the ground end 126 (or one end surface 180*e* of the conductive pillar 180). Although each of the openings 602 merely exposes a part of the ground surface 126*g* in the embodiment, the disclosure is not limited to this embodiment. In other embodiments, each of the openings 602 may expose the whole ground surface 126*g*.

After the openings 602 are formed, the metal layer 160 is deposited on the encapsulation layer 140 by physical vapor deposition (PVD), such as sputtering (referring to FIG. 1A). The metal layer 160 covers the openings 602 and directly touches the ground surface 126*g* of the ground end 126. Therefore, the electronic package module 10 as shown in FIG. 1A is formed. It is worth mentioning, the circuit substrate 100 (and the encapsulation layer 140 located on the circuit substrate 100) is cut into a plurality of singulated elements by methods, such as machine cutting, laser cutting or focus ion beam cutting before the metal layer 160 is deposited.

In addition, the embodiment further includes disposing the conductive pillar 180 on the flat surface 100*f* of the circuit substrate 100 before the encapsulation layer 140 is formed. As shown in FIG. 6B, after the encapsulation layer 140 and the openings 602 are formed, the top surface of the encapsulation layer 140 protrudes from the end surface 180*e* of the conductive pillar 180, while the openings 602 expose the end surface 180*e*. As a result, the metal layer 160 may directly touch the end surface 180*e* during the process of depositing the metal layer 160, so that the conductive pillar 180 is electrically connected to the metal layer 160 and the circuit substrate 100.

In another embodiment, the conductive material 370 (shown in FIG. 3) is disposed within the openings 602 after the openings 602 are formed. Afterwards, the metal layer 160 is deposited on the encapsulation layer 140, and thus the metal layer 160 directly touches the conductive material 370.

Figure 7A:
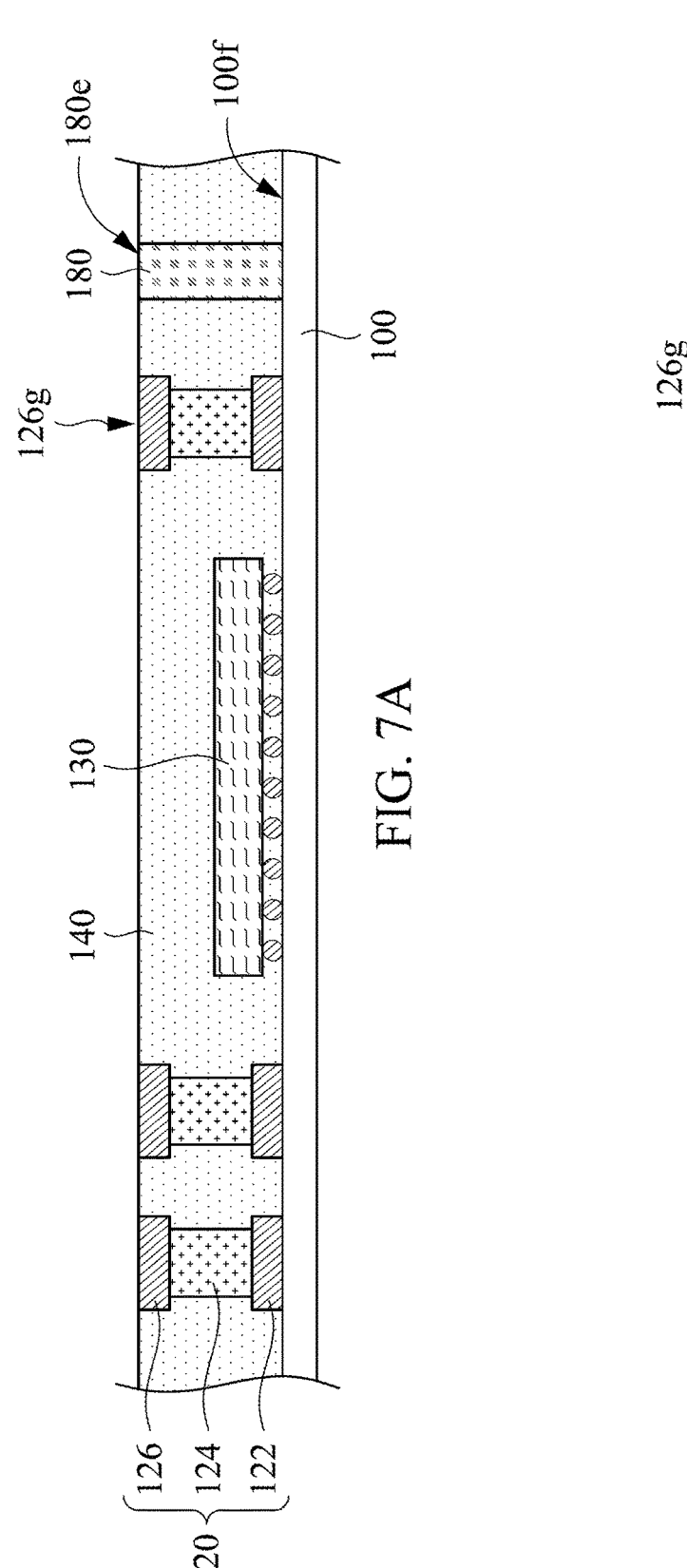
FIG. 7A to FIG. 7B illustrate cross-sectional views of a method for fabricating an electronic package module in accordance with another embodiment of the present disclosure.
Figure 7B:
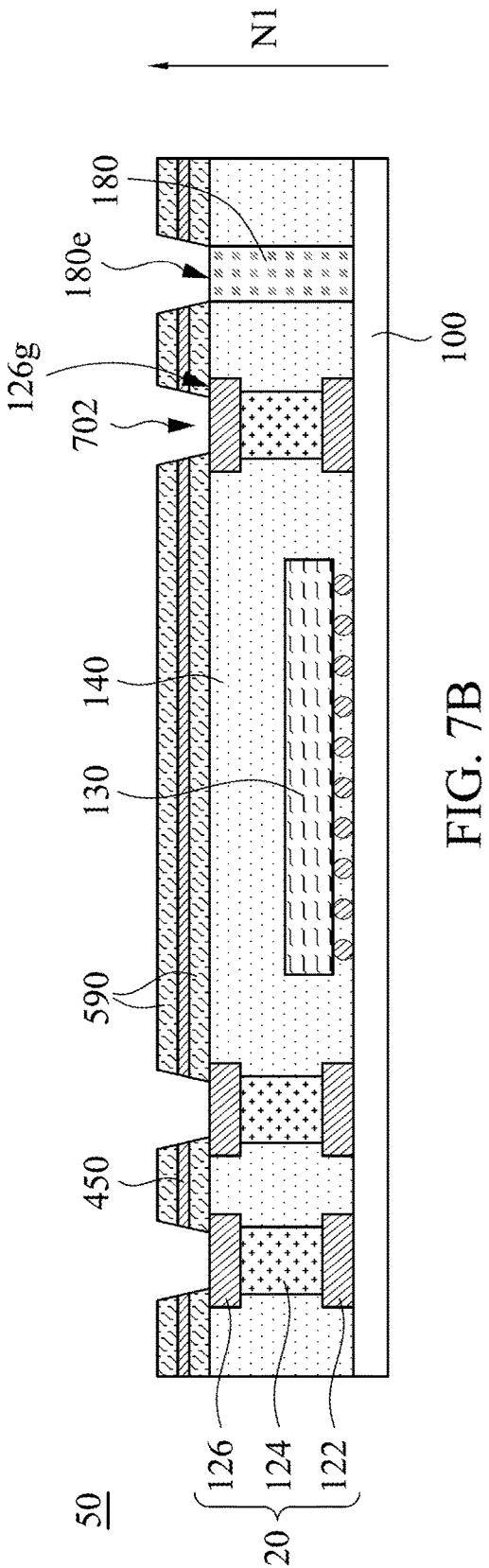

FIG. 7A to FIG. 7B illustrate sequent steps of this method in accordance with another embodiment of present disclosure. The step of FIG. 7A may follow on the step of FIG. 6A in aforementioned embodiment. For instance, the encapsulation layer 140 may be formed on the circuit substrate 100 after the electronic component 120 (and the conductive pillar 180) is disposed on the flat surface 100*f* of the circuit substrate 100, and the top surface (not denoted) of the encapsulation layer 140 is aligned to the ground surface 126*g* of the ground end 126.

For instance, the initial encapsulation layer (not shown) is formed on the circuit substrate 100, and then the initial encapsulation layer is grinded into the encapsulation layer 140 as shown in FIG. 7A by a method, such as machine grinding. It is worth mentioning, in some embodiments, the top surface (not denoted) of the electronic component 130 may protrude from the ground surface 126*g* of the electronic component 120. Thus, the top surface of the electronic component 130 may be aligned to the ground surface 126*g* of the electronic component 120 due to the grinding process.

Referring to FIG. 7B, the insulation film 590 is disposed on the encapsulation layer 140 after the encapsulation layer 140 which is aligned to the ground surface 126*g* is formed. The insulation film 590 covers the top surface (not denoted) of the encapsulation layer 140, the ground surface 126*g* of the electronic component 120 and the end surface 180*e* of the conductive pillar 180. It is worth mentioning, the conductive layer 450 is located in the insulation film 590 in this embodiment. Thus, the step of disposing the conductive layer 450 on the encapsulation layer 140 is also included. The conductive layer 450 covers the top surface (not denoted) of the encapsulation layer 140, the ground surface 126*g* of the electronic component 120 and the end surface 180*e* of the conductive pillar 180.

Furthermore, in one of the embodiments, the conductive layer 450 (as shown in FIG. 4) is disposed by methods, such as spraying, sputtering, electroless plating or similarity thereof after the encapsulation layer 140 which is aligned to the ground surface 126*g* is formed. The conductive layer 450 covers the top surface of the encapsulation layer 140 and directly touches the ground surface 126*g* of the electronic component 120 and the end surface 180*e* of the conductive pillar 180. Another encapsulation layer (not shown) is formed on the conductive layer 450 after the conductive layer 450 is disposed, so that the whole conductive layer 450 is covered. Afterwards, the metal layer 160 is deposited on this encapsulation layer (not shown) to form the electronic package module 40 as shown in FIG. 4.

Referring to FIG. 7B, the plurality of openings 702 are formed on the insulation film 590 after the insulation film 590 is disposed, while the openings 702 separately overlap the electronic component 120 and the conductive pillar 180. Specifically, each of the openings 702 overlaps one electronic component 120 ore one conductive pillar 180 and exposes the ground surface 126*g* of the electronic component 120 or the end surface 180*e* of the conductive pillar 180.

After the openings 702 are formed, the metal layer 160 is deposited on the insulation film 590 (referring to FIG. 5). The metal layer 160 covers the openings 702 and directly touches the ground surface 126*g* of the ground end 126 (and the end surface 180*e* of the conductive pillar 180). Thus, the electronic package module 50 of the FIG. 5 is formed. It is worth mentioning, the circuit substrate 100 (and the encapsulation layer 140 and the insulation film 590 located on the circuit substrate 100) is cut into a plurality of singulated elements by methods, such as machine cutting, laser cutting or focus ion beam cutting before the metal layer 160 is deposited.

Since the metal layer 160 is formed after the circuit substrate 100 (and the encapsulation layer 140 and the insulation film 590 located on the circuit substrate 100) is cut into a plurality of singulated elements, the metal layer 160 may cover the whole top surface (not denoted) and the side surface (as shown in FIG. 4) of the encapsulation layer 140. Therefore, the electronic component 120 is electromagnetically shielded by the metal layer 160 and is prevented from the interference of signal outside the electronic package module 10.

In conclusion, compared with the way of connecting the input end and the ground end to the circuit substrate (i.e., disposing the electronic component on the circuit substrate horizontally), the way of disposing the electronic component on the circuit substrate perpendicularly needs less area since only the input end should be connected to the circuit substrate. In other words, the way of disposing the electronic component perpendicularly may increase the quantity of the electronic components disposed on the circuit substrate within the same size of area.

In addition, the metal layer and the circuit substrate are located on two opposite sides of the electronic package module, and the electronic component is electrically connected to the circuit substrate and the metal layer through the input end and the ground end separately. Therefore, the electronic component can be formed as an electromagnetic shielding structure between the metal layer and the circuit substrate. The structure is used for shielding from the signal interference among components of the electronic package module. Thus, the cost and the occupied space for electromagnetically shielding materials of package modules can be saved. On the other hand, apart from increasing the quantity of grounding path by disposing the conductive pillars between the metal layer and the circuit substrate, the quantity of grounding path is increased by disposing the conductive layer which is electrically connected to the ground end. Therefore, the grounding efficiency is increased.

Although the embodiments of the present disclosure have been disclosed as above in the embodiments, they are not intended to limit the embodiments of the present disclosure. Any person having ordinary skill in the art can make various changes and modifications without departing from the spirit and the scope of the embodiments of the present disclosure. Therefore, the protection scope of the embodiments of the present disclosure should be determined according to the scope of the appended claims.

What is claimed is:

1. An electronic package module, comprising:

a circuit substrate including a flat surface;

an electronic component disposed on the circuit substrate and including:

an input end located on the flat surface of the circuit substrate and electrically connected to the circuit substrate;

a main part located on the input end; and a ground end located on the main part, wherein the input end and the ground end are separately located on two opposite sides of the main part;

an encapsulation layer partially covering the electronic component;

a metal layer located above the encapsulation layer and electrically connected to the ground end;

an insulation film disposed between the encapsulation layer and the metal layer, wherein the insulation film partially covers the electronic component; and a conductive layer located in the insulation film and partially covering the electronic component;

wherein the insulation film includes a first opening, located on the ground end, and the metal layer extends into the first opening and is connected to the conductive layer and the ground end through the first opening; and wherein the input end and the main part are located between the ground end and the circuit substrate, and the input end, the main part and the ground end are arranged along a normal direction of the flat surface.

2. The electronic package module of claim 1, further comprising:

a conductive pillar disposed between the metal layer and the circuit substrate, wherein the conductive pillar is electrically connected to the metal layer and the circuit substrate.

3. The electronic package module of claim 2, wherein the insulation film includes a second opening located on the conductive pillar, and the metal layer extends into the second opening and is connected to the conductive layer and the conductive pillar through the second opening.

4. The electronic package module of claim 3, wherein the conductive layer is electrically connected to the ground end and the conductive pillar.

5. A method for fabricating an electronic package module, comprising:

providing a circuit substrate, and the circuit substrate has a flat surface;

providing an electronic component including a main part, an input end and a ground end separately located on two sides of the main part; and perpendicularly disposing the electronic component on the flat surface of the circuit substrate, and the input end is connected to the circuit substrate, wherein the ground end is disposed away from the circuit substrate along with a normal direction of the flat surface, wherein the ground end overlaps the input end in the normal direction;

forming an encapsulation layer on the circuit substrate;

exposing a ground surface of the ground end from the encapsulation layer;

disposing a first insulation film on the encapsulation layer and the ground surface of the ground end;

disposing a conductive layer on the first insulation film;

disposing a second insulation film on the conductive layer; and exposing a part of the ground surface of the ground end by forming an opening extending through the first insulation film, the conductive layer and the second insulation film; and disposing a metal layer on the second insulation film and the opening, wherein the metal layer directly touches the ground surface of the ground end through the opening.

6. The method of claim 5, further comprising:

disposing a conductive pillar on the flat surface of the circuit substrate before the encapsulation layer is formed, wherein the conductive pillar is electrically connected to the metal layer and the circuit substrate.

* * * * *